(12) United States Patent
Chen

(10) Patent No.: US 7,388,406 B2
(45) Date of Patent: Jun. 17, 2008

(54) CML CIRCUIT DEVICES HAVING IMPROVED HEADROOM

(75) Inventor: Jinghong Chen, Basking Ridge, NJ (US)

(73) Assignee: Agere Systems Inc., Allentown, PA (US)

( * ) Notice: Subject to any disclaimer, the term of this patent is extended or adjusted under 35 U.S.C. 154(b) by 72 days.

(21) Appl. No.: 11/420,098

(22) Filed: May 24, 2006

(65) Prior Publication Data

US 2007/0018693 A1 Jan. 25, 2007

Related U.S. Application Data

(60) Provisional application No. 60/698,375, filed on Jul. 12, 2005.

(51) Int. Cl.
*H03K 19/20* (2006.01)
*H03K 19/094* (2006.01)

(52) U.S. Cl. .................. 326/115; 326/112; 326/121

(58) Field of Classification Search .......... 326/112, 326/115, 121, 104, 108, 126, 127
See application file for complete search history.

(56) References Cited

U.S. PATENT DOCUMENTS

| | | | | |
|---|---|---|---|---|
| 6,433,612 | B1 * | 8/2002 | Jenkins | 327/408 |
| 6,489,811 | B2 * | 12/2002 | Jenkins | 326/115 |
| 6,686,787 | B2 * | 2/2004 | Ling | 327/203 |
| 6,777,988 | B2 * | 8/2004 | Tung et al. | 327/115 |
| 6,825,707 | B2 | 11/2004 | Viehmann et al. | |
| 7,154,294 | B2 * | 12/2006 | Liu et al. | 326/27 |
| 2003/0141912 | A1 * | 7/2003 | Sudjian | 327/208 |
| 2004/0100307 | A1 * | 5/2004 | Wong et al. | 326/115 |
| 2004/0140831 | A1 | 7/2004 | Wang | |
| 2004/0227573 | A1 | 11/2004 | Soda | |

OTHER PUBLICATIONS

Jinghong Chen et al., Agere Systems, Allentown, PA and Jenshan Lin, Dept. of Electrical Engineering, University of Florida, Gainesville, FL, "Electrical Backplane Equalization Using Programmable Analog Zeros and Folded Active Inductors," 0-7803-9197-7/05 © 2005 IEEE, pp. 1366-1369.
Office Action dated Sep. 25, 2007 in U.S. Appl. No. 11/421,675.

\* cited by examiner

*Primary Examiner*—Rexford Barnie
*Assistant Examiner*—Dylan White
(74) *Attorney, Agent, or Firm*—Duane Morris LLP

(57) ABSTRACT

A CML digital circuit includes a load coupled between a power supply node and at least one output node and a logic circuit component coupled to the output node. The logic circuit component has at least one data input node. The logic circuit component comprises a first circuit module and a second circuit module. A first tail current source is coupled to the first circuit module. A second tail current source is coupled to the second circuit module. A first switch is coupled between the power supply node and the first tail current source. A second switch is coupled between the power supply node and the second tail current source, wherein the first switch is triggered to deactivate the first circuit module when the second circuit module is operating and the second switch is triggered to deactivate the second circuit module when the first circuit module is operating.

20 Claims, 4 Drawing Sheets

10

10A

50

50A

CML CIRCUIT DEVICES HAVING IMPROVED HEADROOM

CROSS-REFERENCE TO RELATED APPLICATION

This application claims priority to U.S. Provisional Patent Application Ser. No. 60/698,375 filed Jul. 12, 2005 and entitled "Electrical Backplane Equalization Using Programmable Analog Zeros And Folded Active Inductors", the entirety of which is hereby incorporated by reference herein.

FIELD OF THE INVENTION

The present invention relates generally to logic circuits, and more particularly to current mode logic circuits.

BACKGROUND OF THE INVENTION

When high-speed and low voltage swing data transfer is needed, differential signaling (also commonly referred to as double ended signaling) is perhaps the most robust and promising signaling concept. Differential signaling can add an additional measure of noise immunity due to the fact that the transmitted signal is carried on two conductors and is the difference of the two signals on the two conductors. Current mode logic (CML), a design technique commonly used in high speed signaling applications such as high-speed data communication systems, communications chips and routers, uses differential signaling.

Current-mode-logic (CML) circuits have been widely used in high-speed data communication systems due largely in part to improved switching speeds when compared with voltage-mode-logic circuits. CML circuits can operate with low signal voltage and higher operating frequency at lower supply voltage than static CMOS circuits. CML is also widely used in high-speed applications due to its relatively low power consumption and low supply voltage when compared to other types of logic designs, such as emitter coupled logic (ECL). CML is also considerably faster than CMOS due to its lower voltage swings.

CML has an additional advantage over other high-speed forms of logic such as logic using Gallium Arsenide (GaAs) in that CML can be fabricated using the same fabrication lines as the widely used CMOS circuits, thus allowing CML circuits to be created on high-technology fabrication lines without requiring a significant outlay of money to create a special fabrication line. Additionally, CML logic may cohabitate with CMOS logic on the same integrated circuit. Therefore, such hybrid circuits can combine the high-speed aspects of CML logic and the low power requirements of CMOS logic.

As those in the art will understand, the standard MOS CML structure, whether MUX circuit, AND2 gate, data latch, etc., comprises three main parts: the pull up resistors, the pull down network switch and the current source. The inputs to the pull down network are fully differential. The pull down network can implement any logic function (MUX, AND, OR, XOR, etc.) but must have a definite value for all possible input combinations. The pull down network is regulated by a constant current source referred to as the tail current source. The pull down network steers the current from the current source to one of the pull up resistors based upon the implemented logic function. The resistor connected to the current source through the pull down network will have current flowing therethrough, causing a voltage drop, whereas the other resistor will not have any current flowing through its output node and will be pulled up to VDD. The output swing is set exclusively by the amount of current and the value of the resistor load and is generally much smaller than VDD, in the order of a few hundred millivolts.

FIG. 1 is a circuit diagram of a prior art CML data latch 10, more specifically a falling edge triggered CML D flip-flop. The operation and structure of the data latch 10, as well as modification thereto, should be familiar to those in the art, but are briefly described hereafter. The CML data latch 10 includes a pair of differential outputs OUTP and OUTN coupled to load resistors R1 and R2; a tail current source 12 which may comprises a NMOS transistor; an input tracking stage including transistors M3 and M4, utilized to sense and track the data variation, e.g., the data signals data not (DN) and data (D); and a cross-coupled regenerative pair, transistors M5 and M6, for providing positive feedback to store the data. The track and latch modes are determined by the clock signal input to a second differential pair, transistors M1 and M2.

When signal clock not (CLKB) is high, selection transistor M1 is on, coupling tail current source 12 to the track transistors M3, M4. Selection transistor M2, coupled to latch transistors M5 and M6, receives low signal CLK and is off, disconnecting transistors M5 and M6 from current source 12. Transistors M5 and M6 are off. In this state, the track transistors M3, M4 essentially sense and transfer the data to the outputs OUTP and OUTN. If D is high, meaning DN is low, M4 is on and M3 is off. Node OUTP goes to VDD, as no current flows through resistor R1. Node OUTN goes to a lower voltage (VDD−R2*$i_t$), as the tail current flows through transistor M4 and R2.

When CLK is high, M1 is off, the tracking mode is disabled meaning that the tracking transistors M3 and M4 are disconnected from current source 12. Selection transistor M2 is on enabling the tail current $i_t$ to flow through the regenerative pair consisting of transistors M5 and M6 which stores the logic state at the OUTP and OUTN nodes. Whatever data at nodes OUTN and OUTP at this transition time are latched. The outputs stay at this data state until the next clock transition, thereby isolating the output from the input.

In deep submicron CMOS technologies, such as 0.13 μm technology and below, the typical power supply is 1.0V. Often, a power supply has +5% to −10% tolerance variations. Therefore, with a 1.0V VDD, the worst case power supply can be 0.9V. In the circuit of FIG. 1, the output swing is set exclusively by the amount of tail current ($i_t$) and the value of the resistor load (R1, R2) and is generally much smaller than VDD, in the order of a few hundred millivolts. In most data communication applications, a single-ended-peak output swing of 0.2V (e.g., R*$i_t$/2) is often required. With a single-ended-peak output swing of 0.2V, the output common mode voltage of the latch circuit is 0.7V (e.g., VDD−0.2V). The CML latch circuit 10 suffers from severe headroom problems when designed in a 1.0V (worst case 0.9V) supply voltage. When CLKB is high, the common-mode voltage at the inputs (e.g., D and DN) needs to ensure that transistors M3, M4, M1 and the tail current transistor are operated in saturation mode. Similarly, when CLK is high, the common-mode voltage at the outputs (e.g., OUTP and OUTN) needs to drive transistors M5, M6, M2 and the tail current transistor into saturation mode. Therefore, the common-mode voltage at both the inputs and the outputs need to satisfy the following equation:

$$V_{CM} \geq V_{TH\text{-}NMOS} + 2V_{DSAT\text{-}NMOS}. \tag{1}$$

In EQ. (1), $V_{TH\text{-}NMOS}$ is the threshold voltage of the NMOS transistor and is typically about 0.4 to 0.5V in a deep submicron technology; and $V_{DSAT\text{-}NMOS}$ is the saturation drain-to-source voltage of the NMOS transistor and is typically around 0.2V. As a result, a $V_{CM}$ larger than at least 0.8V (0.4V+2*0.2V) is required to operate the latch circuit properly. With a worst case VDD of 0.9V and a single-ended-peak output swing of 0.2V (and therefore an output common-mode voltage of 0.7V), the output common-mode voltage is insufficient to drive the transistors into saturation mode. The input nodes (e.g., D and DN) of the latch circuit is often connected to the output nodes of a previous stage CML circuit and therefore the input common-mode is set by the output common-mode voltage of the previous CML circuit. Therefore, it is also difficult to set the input common-mode voltage to be above 0.8V. The design therefore suffers severe headroom problems. The latch circuit cannot acquire a wide input common-mode range, and the output swing of the latch circuit is small reducing the robustness of the circuit. In addition, with the devices in the triode region, the power supply rejection (i.e., rejection of noise from the power supply) is poor resulting in noisy output waveforms.

Addressing these problems in deep submicron CMOS technology is particularly difficult because the threshold voltage $V_{TH\text{-}NMOS}$ and the saturation drain-to-source voltage $V_{DSAT\text{-}NMOS}$ do not shrink proportionately with reductions in the power supply. Removing the tail current source 12 is one possible method of addressing the headroom issue, thus relying on M1 and M2 to provide the tail current. With this proposed solution, however, the tail current would be inaccurate due to at least the uncertainty of the common-mode voltage and the voltage swing of the CLK and CLKB signals, etc., which results in an inaccurate output common-mode voltage as well as output swing. Also, with an inaccurate tail current, the transconductance of the track stage transistors M3, M4 can vary significantly, requiring oversized transistors M3, M4 for proper tracking operation. Another possible solution to address the headroom issue is to use low threshold voltage transistors. However, this requires extra mask steps in the manufacturing process that are not available in a typical CMOS process. The extra mask steps to lower the threshold voltage also make the manufacturing costs prohibitively expensive.

Therefore, there remains a need for CML circuits, particularly deep submicron CML circuits, with better headroom performance.

SUMMARY OF THE INVENTION

A current mode logic digital circuit is provided. The CML circuit includes a load coupled between a power supply node and at least one output node and a logic circuit component coupled to the output node. The logic circuit component has at least one data input node. The logic circuit component comprises a first circuit module and a second circuit module. A first tail current source is coupled to the first circuit module. A second tail current source is coupled to the second circuit module. A first switch is coupled between the power supply node and the first tail current source. A second switch is coupled between the power supply node and the second tail current source, wherein the first switch is triggered to deactivate the first circuit module when the second circuit module is operating and the second switch is triggered to deactivate the second circuit module when the first circuit module is operating.

A method of operating a CML digital circuit is also provided. When the second circuit module is operating, the first circuit module is deactivated by providing a first current path from the power supply node to the first tail current source to bypass the first circuit module. When the first circuit module is operating, the second circuit module is deactivated by providing a second current path from the power supply node to the second tail current source to bypass the second circuit module.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

CML based logic circuits having improved headroom and methods of improving headroom in CML based logic circuits are provided herein. The technique is described in connection with two examples, a MOS CML data latch circuit and a MOS CML data multiplexer (MUX) circuit, but it should be understood that the techniques described herein are equally applicable to other CML logic circuits, such as CML AND gates, CML OR gates, CML XOR gates, other kinds of CML flip flops as well as other digital logic circuits. The structures of these logic circuits are not each described herein but are readily familiar to those skilled in the art of digital circuit design and data communications.

Figure 1:
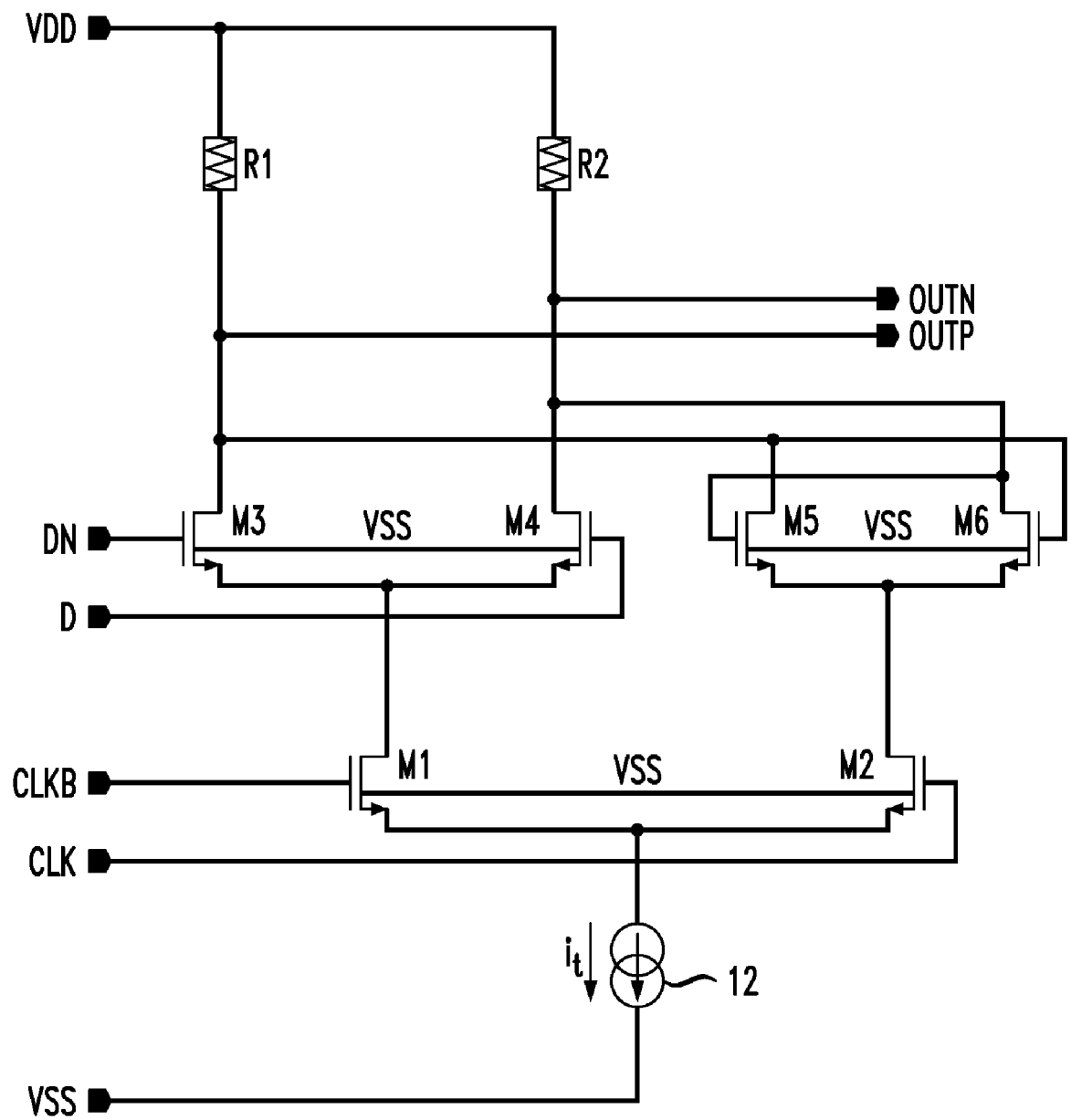
FIG. 1 is a circuit diagram of a prior art CML data latch.
Figure 2:
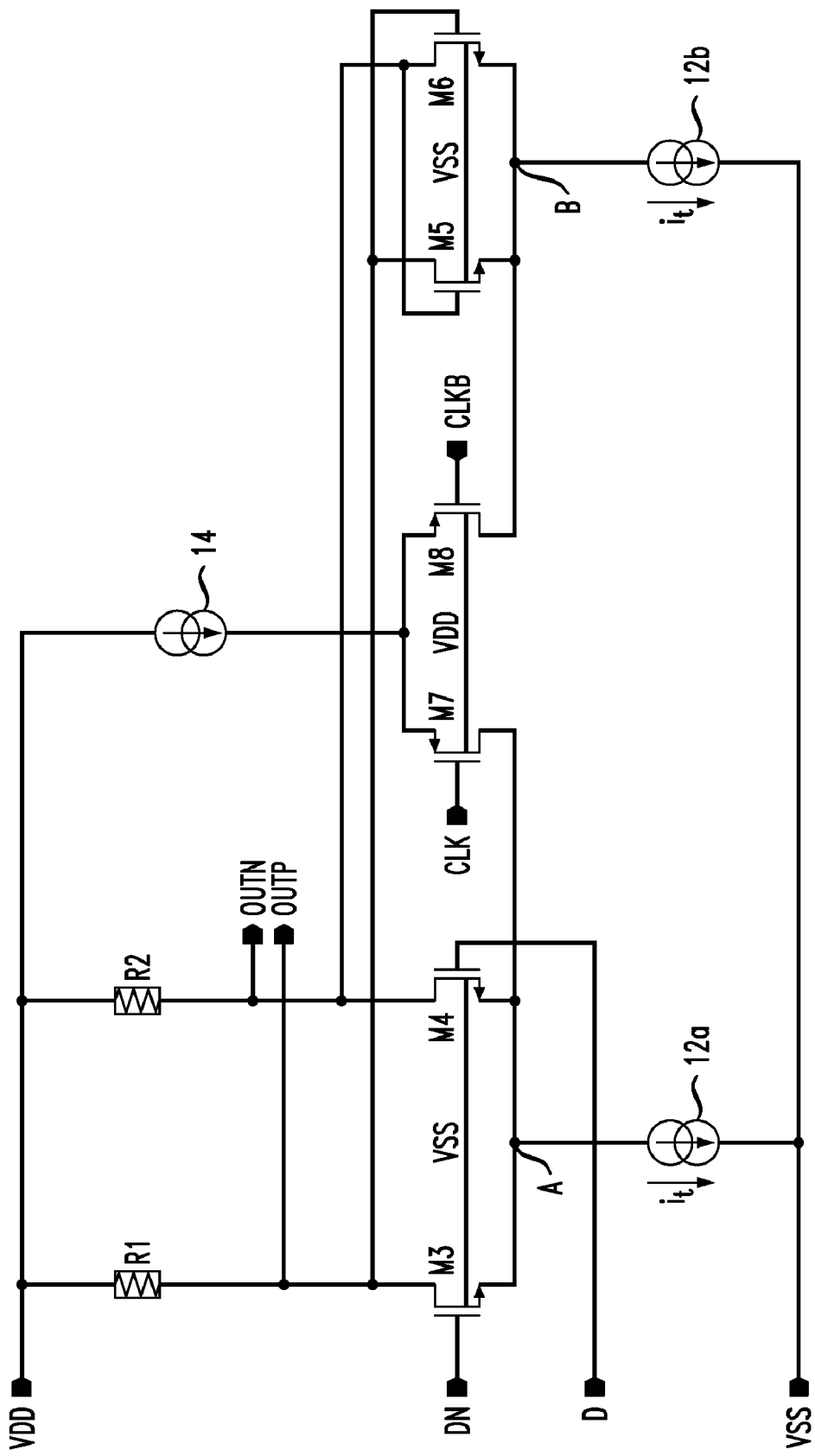
FIG. 2 is a circuit diagram of a CML data latch circuit according to the present invention.

FIG. 2 is a circuit diagram of a CML data latch 10A having improved headroom. Like CML data latch 10 shown in FIG. 1 and described above, CML data latch 10A includes a load stage including load resistors R1 and R2 coupled to output nodes OUTP and OUTN, respectively. Alternatively, the load stage may include other load elements such as MOS transistors and/or include circuit elements for countering parasitic capacitances between the output and ground nodes, such as inductive elements. Resistors R1 and R2 typically comprise doped polysilicon strips. The latch also includes a first circuit module including data tracking transistors M3 and M4 coupled to first data differential pair D, DN and a second circuit module including cross-coupled transistors M5, M6 for data latching. The circuit modules cooperate to perform a logic function, here a flip-flop function. Like data latch 10, each circuit module is coupled to output nodes OUTP and OUTN.

Unlike the data latch 10 of FIG. 1, the data latch 10A of FIG. 2 does not include selection transistors M1 and M2 coupled between the circuit modules and a tail current source 12. Rather, the latch 10A includes a pair of tail current sources 12a, 12b. Each current source provides a constant tail current $i_t$ as described above in connection with the data latch 10 of FIG. 1. The tail current sources 12a, 12b are preferably directly coupled to the first and second circuit modules, respectively, as switch transistors M1 and M2 are not provided. Like tail current source 12, each tail current source 12a, 12b preferably comprises a MOS transistor, such as an NMOS transistor, sized to provide a desired constant tail current $i_t$ when operated in saturation mode.

Rather than utilize selection transistors M1 and M2 to selectively couple the circuit modules to a single tail current source, i.e., to activate and deactivate the circuit modules, bypass transistors M7 and M8 are provided in parallel with the circuit modules. Specifically, transistors M7 and M8 are provided between supply node VDD and ground node VSS and in series with tail current sources 12a, 12b, respectively, and a current source 14. Transistor M7 is controlled by clock signal CLK provided at its gate terminal and transistor M8 is controlled by clock bar signal CLKB provided at its gate terminal. Transistors M7 and M8 are preferably PMOS transistors, though NMOS transistors may be utilized and controlled with CLKB and CLK.

In one embodiment, current source 14 comprises a PMOS transistor. It should be noted that the current flowing through the current source 14 should be equal to $i_t$ (e.g., the current flowing through the current sources 12a and 12b). Current source 14 can be implemented by mirroring current 12a (or 12b) through a current mirror circuitry (not shown).

When CLK is high and CLKB is low, transistor M7 is off and transistor M8 is on. With transistor M7 off, the series connection between current source 14 and current source 12a is broken and data tracking transistors M3 and M4 are coupled to current source 12a and are thus operational. Transistor M8 is on, connecting current source 14 to tail current source 12b, thereby effectively bypassing, and thus deactivating, the latch circuit module containing transistors M5 and M6. Note that according to the Kirchhoffs current law, the current flowing into node B should be equal to the current flowing out of node B (e.g., the sum of all the currents flowing through node B must equal zero). When transistor M8 is on, a constant current $i_t$ from the current from 14 flows through transistor M8 and enters into node B. At the same time, a constant current $i_t$ from current source 12b flows out of node B. Therefore there will be no net current flowing through transistors M5 and M6, e.g., transistors M5 and M6 are effectively bypassed and deactivated. If there is a current flowing through transistors M5 and M6, Kirchhoffs current law would be violated. On the other hand, since transistor M7 is off when CLK is high, the constant current $i_t$ of current source 12a must flow through transistors M3 and M4 resulting in a net current flow through node A of zero. With such an operation, when CLK is high and CLKB is low, the tracking transistor pair (e.g., M3 and M4) will be operational and thus the output (OUTN and OUTP) will track the input (e.g., D and DN).

The circuit operates in a similar manner when CLK is low and CLKB is high. When CLK is low, transistor M7 is on, deactivating the data tracking transistor module M3, M4. When CLKB is high, transistor M8 is off, allowing data latch module M5, M6 to operate.

Because the circuit configuration of data latch 10A does not include a transistor in series with the circuit modules and the tail current sources, the latch circuit 10A includes only two transistors in series between VDD and VSS, at least in the series connections that include the load resistors R1, R2. The circuit 10A, therefore, does not suffer from headroom issues described above in connection with the prior art circuit 10, particularly for deep submicron CMOS technologies where the power supply voltage is 1.0V (worst case 0.9V) and below. The common-mode voltage at the input and the output nodes only need to satisfy the following equation:

$$V_{CM} \geq V_{TH\text{-}NMOS} + V_{DSAT\text{-}NMOS}. \qquad (2)$$

With $V_{TH\text{-}NMOS}=0.4V$, and $V_{DSAT\text{-}NMOS}=0.2V$, the output common-mode voltage can be as low as 0.6V thus leaving enough headroom for the latch circuit to generate a single-ended-peak voltage swing of 0.2V. The improved folded design gains a net $V_{DSAT\text{-}NMOS}$ (typically 0.2V) in headroom. Note that with an output common mode of 0.6V and a worst case power supply of 0.9V, a 0.3V single-ended-peak output swing can be generated. The inputs (e.g., D and DN) can acquire a wide input common-mode range as low as 0.6V as well as a large input signal swing (for example a 0.3V single-ended-peak input signal swing). In the mean time, all the transistors can work properly at the saturation mode. This configuration ensures that the latch circuit can operate robustly as well as provide for improved power supply rejection and consistent output common mode voltage and output swings.

It is also worth noting that a worst case 0.9V supply voltage is sufficient to operate the transistors that form the series of current source 14, transistor M7 (or M8) and current source 12a (or 12b) in the saturation mode. To operate these transistors in the saturation mode, a voltage larger than $3*V_{DSAT\text{-}NMOS}=0.6V$ is required. A worst case power supply voltage of 0.9V is sufficient.

Figure 3:
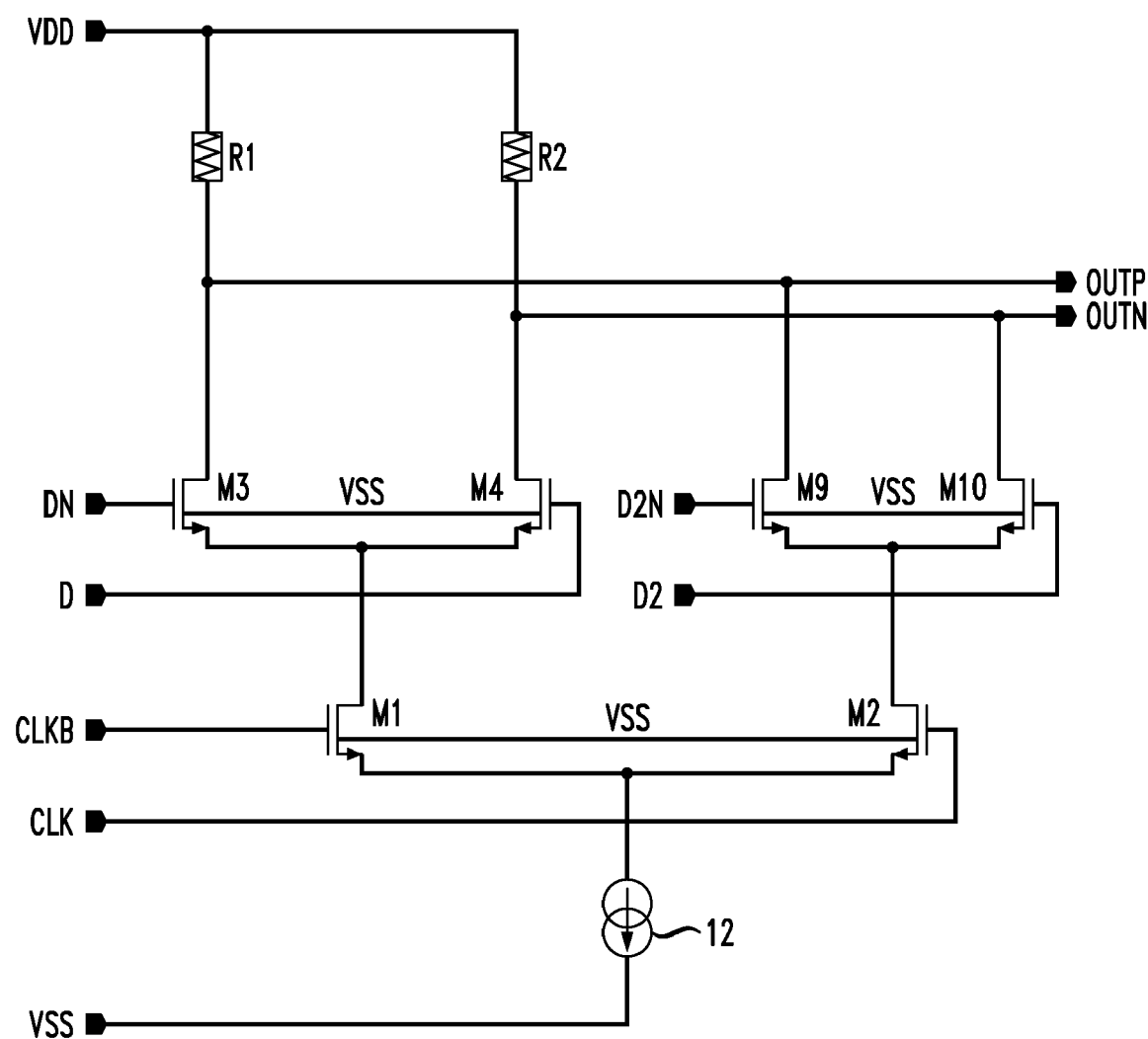
FIG. 3 is a circuit diagram of a prior art CML multiplexer.

FIG. 3 is a circuit diagram of a prior art CML 2:1 MUX circuit 50. Like data latch 10, the MUX 50 has two differential outputs—positive output OUTP and negative output OUTN. Resistors R1 and R2 form resistive loads coupled between the supply rail voltage VDD and the output nodes OUTP and OUTN, respectively.

Like the data latches 10, 10A, MUX 50 includes first and second circuit modules that operate at alternate clock cycles, specifically two data tracking stages. The first module includes a first differential pair of NMOS data tracking transistors M3 and M4. The second module includes a second differential pair of NMOS data tracking transistors M9 and M10. The first differential pair M3, M4 is selected for operation, that is coupled to current source 12, through NMOS selection transistor M1 when clock bar (CLKB) is high. The second differential pair M9, M10 is selected for operation through NMOS selection transistor M2 when clock (CLK) is high. A first pair of differential data inputs D, DN is coupled to the gate inputs of M3, M4. A second pair of differential data inputs D2, D2N is coupled to the gate inputs of M9, M10 for multiplexing with the first data.

The operation of the multiplexer 50 is now described. Assume CLKB is high and CLK is low. CLKB turns on transistor M1, connecting current source 12 to first differential pair M3, M4. Transistor M2 is off, disconnecting second differential pair M9, M10 from the circuit. In this case, the differential outputs (OUTP and OUTN) will track the differential inputs (D and DN), e.g., the differential inputs D and DN are selected and presented at the output of the MUX circuit. On the other hand, when CLK is high and CLKB is low, CLK turns on transistor M2, connecting current source 12 to the second differential pair M9, M10. Transistor M1 is off, disconnecting the first differential pair M3, M4 from the circuit. As a result, the differential outputs (OUTP and OUTN) will track the differential inputs (D2 and D2N), e.g., the differential input D2 and D2N are selected and presented at the output of the MUX circuit. Similar to the reasoning as discussed above accompanying the description of logic circuit 10 of FIG. 1, the multiplexer circuit 50 suffers headroom problem when designed in deep submicron CMOS technologies where the typical power supply is 1.0V (worst case is 0.9V).

Figure 4:
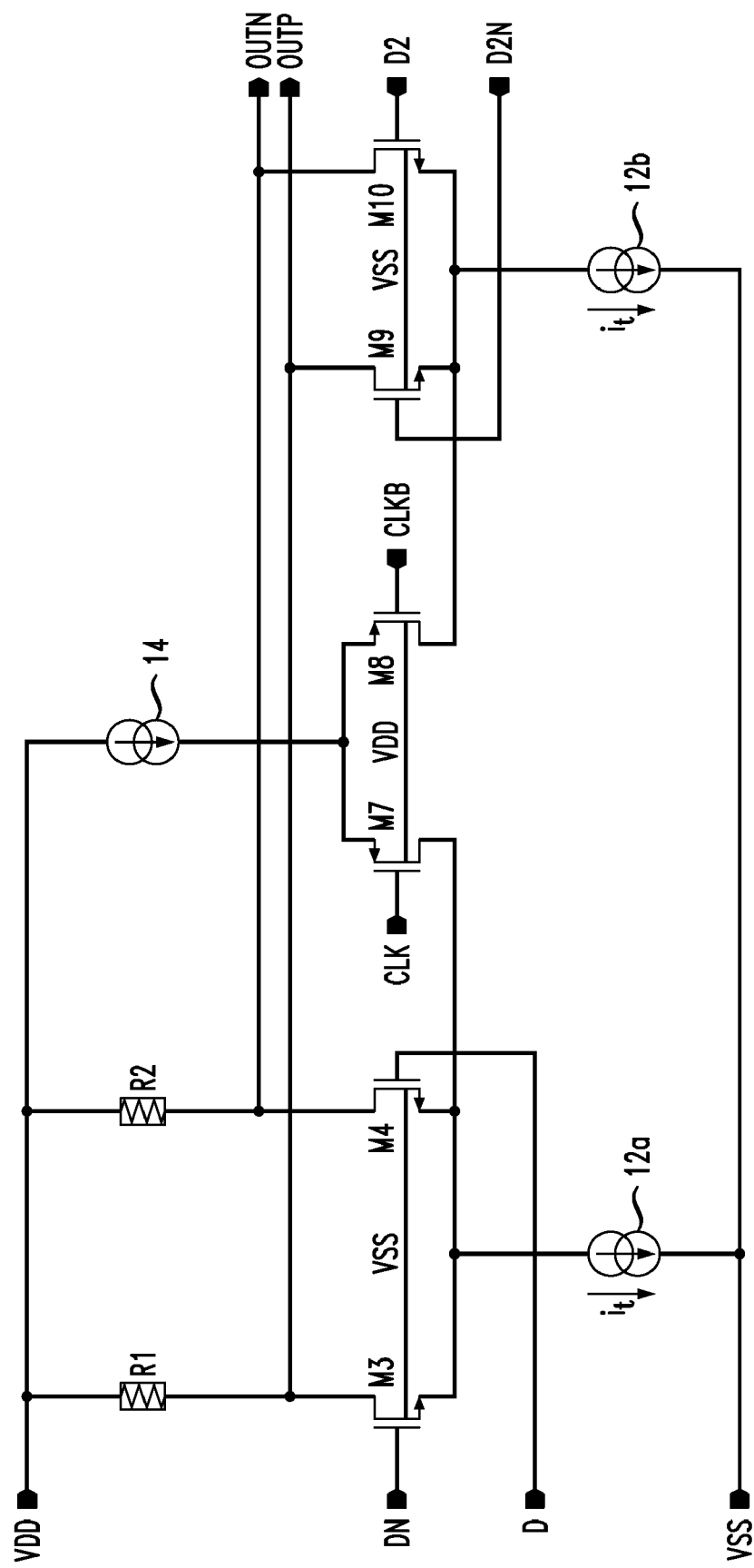
FIG. 4 is a circuit diagram of a CML multiplexer according to the present invention.

Turning to FIG. 4, a circuit diagram is provided for an improved CML MUX 50A having improved headroom. Like CML data MUX 50 shown in FIG. 3 and described above, CML MUX 50A includes load resistors R1 and R2 coupled to output nodes OUTP and OUTN, respectively, as well as first and second data tracking circuit modules, M3, M4 and M9, M10, respectively. Unlike MUX 50, but like data latch 10A, MUX 50A does not include selection transistors M1, M2. Rather, MUX 50A includes current source 14 connected in series with bypass transistors M7, M8 and tail current sources 12a, 12b.

It should be understood from the description provided above for the data latch 10A that because the circuit configuration of MUX 50A does not include a switch transistor in series with the circuit modules and the tail current sources, the MUX 50A includes only two transistors in series between VDD and VSS, at least in the series connections that include the load resistors R1, R2. The circuit 50A, therefore, does not suffer from headroom issues described above in connection with the prior art circuits under worst case, particularly for deep submicron device sizes, such as 0.13 μm, 90 nm, 65 nm and beyond where the power supply is typically 1.0V (worst case 0.9V). This configuration allows enough headroom for the latch circuit to generate a single-ended-peak voltage swing as large as 0.3V. The inputs (e.g., D and DN, and D2 and D2N) can acquire a wide input common-mode range as low as 0.6V as well as a large input signal swing (for example a 0.3V single-ended-peak input signal swing). The configuration also allows all the transistors to work in the saturation mode. Therefore, the MUX circuit 50A can be robustly operated with a large input and output signal swings. The MUX circuit 50A can also provide an improved power supply rejection and consistent output common mode voltage and output swings.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A current mode logic digital circuit comprising:
   a load coupled between a power supply node and at least one output node;
   a logic circuit component coupled to said output node and having at least one data input node, said logic circuit component comprising a first circuit module and a second circuit module;
   a first tail current source coupled to said first circuit module;
   a second tail current source coupled to said second circuit module;
   a first switch coupled between said power supply node and said first tail current source in a first circuit path parallel to the circuit path containing the load and the first circuit module; and
   a second switch coupled between said power supply node and said second tail current source in a second circuit path parallel to the circuit path containing the load and the second circuit module;
   wherein said first switch is triggered to deactivate said first circuit module when said second circuit module is operating and said second switch is triggered to deactivate said second circuit module when said first circuit module is operating.

2. The current mode logic circuit of claim 1, further comprising a current source coupled between said power supply node and said switches, wherein the first switch deactivates the first circuit module by connecting the current source to the first tail current source, effectively creating a current path with the supply node including the first tail current source that bypasses the first circuit module, and
   wherein the second switch deactivates the second circuit module by connecting the current source to the second tail current source, effectively creating a current path with the supply node including the second tail current source that bypasses the second circuit module.

3. The current mode logic circuit of claim 1, wherein said switches comprise PMOS transistors.

4. The current mode logic circuit of claim 1, wherein said tail current sources comprise MOS transistors.

5. The current mode logic circuit of claim 1, wherein said logic circuit component is selected from the group consisting of a multiplexer, an AND gate, an OR gate, a data buffer, a XOR gate, a data latch, and a flip-flop.

6. The current mode logic circuit of claim 1, wherein said load comprises at least one load resistor coupled between said power supply node and said output node.

7. The current mode logic circuit of claim 1, wherein said logic circuit component comprises at least a first pair of differential input nodes, said logic circuit component comprising a pair of differential output nodes, said load comprising first and second loads coupled between said power supply node and said output nodes.

8. The current mode logic circuit of claim 7, wherein said logic circuit component comprises at least first and second pairs of differential inputs nodes.

9. The current mode logic circuit of claim 8, wherein said logic circuit component comprises a multiplexer, said first circuit module comprising first pair of differential tracking transistors for receiving first data differential inputs and coupled between said output nodes and said first tail current source, and said second circuit module comprising a second pair of differential tracking transistors for receiving second data differential inputs and coupled between said output nodes and said second tail current source.

10. The current mode logic circuit of claim 7, wherein said logic circuit component comprises a data latch, said first circuit module comprising a first pair of differential tracking transistors coupled to said first pair of differential input nodes and coupled between said output nodes and said first tail current source, said second circuit module comprising a pair of cross-coupled latching transistors coupled between said output nodes and said second tail current source.

11. A current mode logic digital circuit comprising:
    a load stage coupled between a power supply node and a pair of differential output nodes;
    a logic circuit component coupled to said output nodes and having at least a first pair of differential input nodes, said logic circuit comprising a first circuit module coupled to said output nodes and a second circuit module coupled to said output nodes, said modules operational at different times to implement a logic function;
    a first tail current source coupled to said first circuit module;
    a second tail current source coupled to said second circuit module;
    a first MOS switch transistor coupled between said power supply node and said first tail current source in a first circuit path parallel to the circuit path containing the load stage and the first circuit module;
    a second MOS switch transistor coupled between said power supply node and said second tail current source in a second circuit path parallel to the circuit path containing the load stage and the second circuit module; and a current source coupled between said power supply node and said switch transistors;

wherein said first switch transistor is triggered to deactivate said first circuit module when said second circuit module is operating and wherein said second switch transistor is triggered to deactivate said second circuit module when said first circuit module is operating.

12. The current mode logic circuit of claim 11, wherein said circuit modules operate at alternate clock cycles.

13. The current mode logic circuit of claim 12, wherein said MOS switch transistors are responsive to clock signals.

14. The current mode logic circuit of claim 11, wherein said MOS switch transistors comprise PMOS transistors.

15. The current mode logic circuit of claim 11, wherein said tail current sources comprise MOS transistors.

16. The current mode logic circuit of claim 11, wherein said logic circuit component is selected from the group consisting of a multiplexer, an AND gate, an OR gate, a data buffer, a XOR gate, a data latch, and a flip-flop.

17. A method of operating a current mode logic digital circuit having a load stage coupled between a power supply node and a pair of differential output nodes and a logic circuit component coupled to said output nodes and having at least a first pair of differential input nodes, said logic circuit comprising a first circuit module coupled to said output nodes and to a first tail current source and a second circuit module coupled to said output nodes and to a second tail current source, said method comprising the steps of: when said second circuit module is operating, providing a first current path from said power supply node to said first tail current source to bypass said first circuit module, thereby deactivating said first circuit module; and when said first circuit module is operating, providing a second current path from said power supply node to said second tail current source to bypass said second circuit module, thereby deactivating said second circuit module.

18. The method of claim 17, wherein said modules are operational at different times to implement a logic function.

19. The method of claim 17, wherein one of said deactivating steps is responsive to a clock signal and the other one of said deactivating steps is responsive to a clock bar signal.

20. The current mode logic circuit of claim 11, wherein the first switch deactivates the first circuit module by connecting the current source to the first tail current source, effectively creating a current path with the supply node including the first tail current source that bypasses the first circuit module, and wherein the second switch deactivates the second circuit module by connecting the current source to the second tail current source, effectively creating a current path with the supply node including the second tail current source that bypasses the second circuit module.

* * * * *